(12) United States Patent
Noguchi et al.

(10) Patent No.: US 12,232,261 B2
(45) Date of Patent: Feb. 18, 2025

(54) PRINTED WIRING BOARD

(71) Applicants: SUMITOMO ELECTRIC PRINTED CIRCUITS, INC., Koka (JP); SUMITOMO ELECTRIC INDUSTRIES, LTD., Osaka (JP)

(72) Inventors: Kou Noguchi, Koka (JP); Masaki Miyabara, Koka (JP)

(73) Assignees: SUMITOMO ELECTRIC PRINTED CIRCUITS, INC., Koka (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 230 days.

(21) Appl. No.: 18/007,590

(22) PCT Filed: Mar. 29, 2021

(86) PCT No.: PCT/JP2021/013296
§ 371 (c)(1),
(2) Date: Dec. 1, 2022

(87) PCT Pub. No.: WO2021/246033
PCT Pub. Date: Dec. 9, 2021

(65) Prior Publication Data
US 2023/0199960 A1    Jun. 22, 2023

(30) Foreign Application Priority Data
Jun. 4, 2020   (JP) ................................. 2020-097435

(51) Int. Cl.
*H05K 1/11*      (2006.01)

(52) U.S. Cl.
CPC ......................... *H05K 1/116* (2013.01); *H05K 2201/10287* (2013.01)

(58) Field of Classification Search
CPC ......... H05K 1/116; H05K 2201/10287; H05K 2201/0969; H05K 1/115; H05K 1/111;
(Continued)

(56) References Cited

U.S. PATENT DOCUMENTS 6,998,715 B1 *   2/2006   Fuji ........................ H05K 1/111
                                                         257/773
2008/0277152 A1   11/2008   Watanabe
2011/0240362 A1   10/2011   Matsuo

FOREIGN PATENT DOCUMENTS

JP        2005-322946 A      11/2005
JP        2011-146427 A       7/2011
(Continued)

*Primary Examiner* — Timothy J Thompson
*Assistant Examiner* — Paramita Ghosh
(74) *Attorney, Agent, or Firm* — Oliff PLC

(57) ABSTRACT

A printed wiring board includes: a board having a through-hole; a land portion that is disposed on an inner circumferential surface of the through-hole and on a surface of the board at a circumferential edge of the through-hole, and that has a through-hole conductor portion; and a wire that is disposed on the surface of the board and that has one longitudinal end portion electrically connected to the land portion, a maximum length of a connection portion between the wire and the land portion being greater than or equal to a sum of a maximum diameter of the through-hole and a minimum line width of the wire.

2 Claims, 2 Drawing Sheets

(58) Field of Classification Search
CPC ........... H05K 2201/09372; H05K 1/02; H05K 1/11
See application file for complete search history.

(56) References Cited

FOREIGN PATENT DOCUMENTS

| | | |
|---|---|---|
| JP | 2014-007190 A | 1/2014 |
| JP | 2014-183059 A | 9/2014 |
| JP | 2015-038899 A | 2/2015 |
| KR | 10-2007-0084267 A | 8/2007 |

\* cited by examiner

PRINTED WIRING BOARD

TECHNICAL FIELD

The present disclosure relates to a printed wiring board. The present application claims priority to Japanese Patent Application No. 2020-097435 filed on Jun. 4, 2020, the entire contents of which are hereby incorporated by reference.

BACKGROUND ART

PTL 1 describes a printed wiring board including: a board; a through-hole extending through the board; a land portion disposed on a surface of the board and having a through-hole conductor portion; and a wire disposed on the surface of the board and having one longitudinal end portion electrically connected to the land portion (see Japanese Patent Laying-Open No. 2011-146427).

CITATION LIST

Patent Literature

PTL 1: Japanese Patent Laying-Open No. 2011-146427

SUMMARY OF INVENTION

A printed wiring board according to an aspect of the present disclosure includes: a board having a through-hole; a land portion that is disposed on an inner circumferential surface of the through-hole and on a surface of the board at a circumferential edge of the through-hole, and that has a through-hole conductor portion; and a wire that is disposed on the surface of the board and that has one longitudinal end portion electrically connected to the land portion, a maximum length of a connection portion between the wire and the land portion being greater than or equal to a sum of a maximum diameter of the through-hole and a minimum line width of the wire.

DETAILED DESCRIPTION

Figure 1:
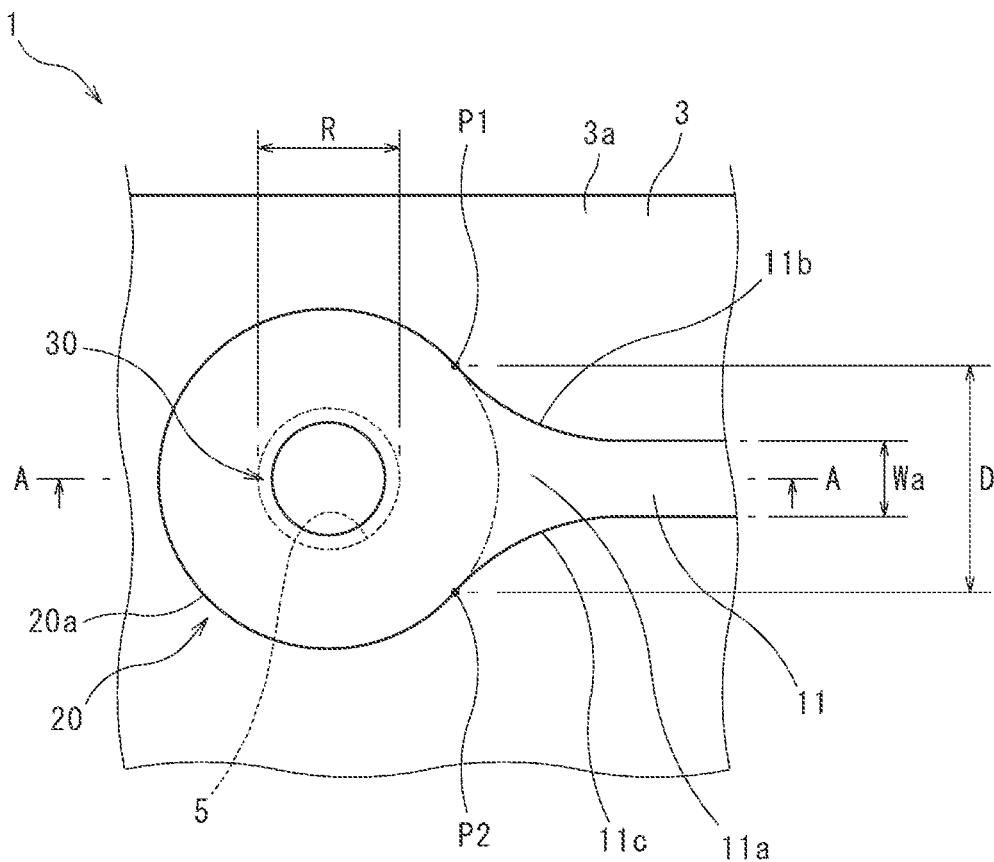
FIG. 1 is a schematic plan view showing a printed wiring board of a first embodiment.

Printed wiring boards are widely used to form circuits of various electronic devices. In recent years, with electronic devices becoming increasingly smaller, printed wiring boards have been reduced in size and increased in wiring density significantly.

As such a printed wiring board, for example, the printed wiring board described in above-mentioned PTL 1 has been proposed.

Problem to be Solved by the Present Disclosure

A printed wiring board as described above, however, may be affected by shrinkage and warpage of a board during manufacture, resulting in positional displacement during formation of a through-hole for a through-hole conductor portion. Such positional displacement may cause a land cutoff Even if the land cutoff does not occur, the through-hole conductor portion may have reduced dimensions due to the positional displacement. When stress is concentrated by handling or the like on the through-hole conductor portion having such reduced dimensions, microcracks may occur, resulting in conduction failure.

Therefore, it is an object to provide a printed wiring board with suppressed conduction failure.

Advantageous Effect of the Present Disclosure

In a printed wiring board according to an aspect of the present disclosure, conduction failure is suppressed.

Description of Embodiments of the Present Disclosure

A printed wiring board according to an aspect of the present disclosure includes: a board having a through-hole; a land portion that is disposed on an inner circumferential surface of the through-hole and on a surface of the board at a circumferential edge of the through-hole, and that has a through-hole conductor portion; and a wire that is disposed on the surface of the board and that has one longitudinal end portion electrically connected to the land portion, a maximum length of a connection portion between the wire and the land portion being greater than or equal to a sum of a maximum diameter of the through-hole and a minimum line width of the wire.

Here, the present inventors conducted extensive research and made the following findings. That is, when manufacturing a printed wiring board using a subtractive process, a through-hole for a through-hole conductor portion is first formed in a board, and then an inner circumferential surface of the through-hole, a circumferential edge of the through-hole on the board, and other regions are plated with a conductive base layer. Next, this conductive base layer is plated with a plating layer for a land portion having the through-hole conductor portion and for a wire. Next, regions of the plating layer for forming the land portion and the wire are masked with a resist pattern. Then, with this resist pattern as a mask, the plating layer is removed such as by etching using an etchant. That is, the plating layer and the conductive base layer located in openings of the resist pattern are removed. The land portion and the wire are thus formed. The position where the resist pattern is formed is set in advance.

In such a subtractive process, if the position where the through-hole is formed is displaced from a predetermined design position, the regions to be masked with the resist pattern are also displaced. Due to this positional displacement, the etchant may enter an inner circumferential surface of the through-hole conductor portion during the etching. Since the etchant can remove the plating layer and the conductive base layer, the etchant that enters a hole in the through-hole conductor portion will remove the through-hole conductor portion. In this manner, in the subtractive process, if the position where the through-hole for the through-hole conductor portion is formed is displaced from the predetermined design position, the through-hole conductor portion is removed, possibly resulting in conduction failure such as a land cutoff in the through-hole conductor portion. In addition, if the through-hole extends through a region which is a connection portion between the land portion and the wire, or through a region which is a part of the wire, conduction failure may occur also in the connection portion or the wire due to the conduction failure in the through-hole conductor portion.

When manufacturing a printed wiring board using a semi-additive process, on the other hand, a through-hole for a through-hole conductor portion is first formed in a board, and then the board and an inner circumferential surface of the through-hole are plated with a conductive base layer, as in the subtractive process. Next, a resist pattern for forming the through-hole conductive portion, a land portion, and a wire is formed on this conductive base layer. Then, openings in the resist pattern on the conductive base layer are plated with a plating layer for the land portion having the through-hole conductor portion and for the wire. That is, the plating layer is formed in the openings of the resist pattern. Next, the resist pattern is removed, and with the plating layer as a mask, the conductive base layer is removed such as by etching using an etchant. The land portion having the through-hole conductive portion and the wire are thus formed. The position where the resist pattern is formed is set in advance.

Also in such a semi-additive process, if the position where the through-hole is formed is displaced from a predetermined design position, the regions to be masked with the resist pattern are also displaced. However, even if such positional displacement occurs, if the displacement is to such an extent that a plating solution can enter the through-hole (that is, that the position where the through-hole is formed does not completely deviate from the predetermined position), the plating solution can flow into the conductive base layer of the through-hole, thus enabling the formation of a plating layer on the conductive base layer in the through-hole. In this manner, in the semi-additive process, even upon displacement of the position where the through-hole for the through-hole conductor portion is formed, conduction failure in the through-hole conductor portion is less likely to occur. In addition, even if the through-hole extends through a region which is a connection portion between the land portion and the wire, or through a region which is a part of the wire, conduction of the connection portion and the part of the wire can be ensured via the through-hole conductor portion.

If the position of the through-hole completely deviates from (does not overlap with) the predetermined design position, it is difficult to leave or form the through-hole conductor portion, whether with the subtractive process or the semi-additive process, resulting in failure to ensure conduction.

As described above, by manufacturing a printed wiring board using the semi-additive process instead of the subtractive process, the occurrence of conduction failure in the through-hole conductor portion can be reduced even upon positional displacement of the through-hole, as long as the position of the through-hole overlaps with the predetermined design position. In addition, even if the through-hole extends through the connection portion between the land portion and the wire, or through a part of the wire, to divide the connection portion and the wire, conduction of the connection portion and the part of the wire can be ensured via the through-hole conductor portion.

However, such conduction of the connection portion and a part of the wire via the through-hole conductor portion may be considered as unstable connection. Therefore, it is preferable that a region of the connection portion and the wire through which the through-hole extends be small.

The present inventors thus conducted further extensive research, and found that by setting, in plan view, a maximum length of the connection portion between the wire and the land portion (that is, a distance between intersections (two intersections) of the land portion and two outermost side edges of the wire) to be greater than or equal to the sum of a maximum diameter of the inner circumferential surface of the through-hole in the board and a minimum line width of the wire, the extent to which the through-hole extends through the region which is the connection portion, and the extent to which the through-hole extends through the wire can be reduced, even with a relatively large positional displacement of the through-hole, and conduction failure can thereby be suppressed.

In this manner, with the maximum length of the connection portion being in the above range, conduction failure of the printed wiring board can be suppressed even upon displacement of the position where the through-hole for the through-hole conductor portion is formed.

The one end portion of the wire may have a plurality of branched portions, and the maximum length of the connection portion may be a distance between two intersections of two outermost end edges of the plurality of branched portions in a width direction of the branched portions and the land portion.

In this manner, with the one end portion of the wire having the plurality of branched portions, conduction failure can be more reliably suppressed even upon positional displacement of the through-hole.

The "maximum length of the connection portion" as used here refers to a length between two intersections of two outermost end edges of the wire and the land portion. Specifically, when the end portion of the wire on the land portion side is not branched, the "maximum length of the connection portion" corresponds to a length of the entire connection portion between the wire and the land portion, and when the end portion of the wire on the land portion side is branched, the "maximum length of the connection portion" corresponds to a length of the connection portion including a spacing between the branched portions, that is, a length between two outermost intersections of the connection portion between the branched portions and the land portion. The "maximum diameter of the through-hole" refers to a diameter having the largest value of the diameters of the inner circumferential surface of the through-hole. The "line width" refers to a dimension of the wire in a direction perpendicular to a longitudinal direction of the wire, and the "minimum line width" refers to a minimum line width of the wire in the longitudinal direction of the wire.

Details of Embodiments of the Present Disclosure

Embodiments of a printed wiring board according to the present disclosure are hereinafter described in detail with reference to the drawings. In the present embodiment, a "front surface" refers to a surface of a board on which a wire is disposed in a thickness direction of the board, and the front and back of the present embodiment do not determine the front and back of the printed wiring board in a state of use.

First Embodiment

[Printed Wiring Board]

Figure 2:
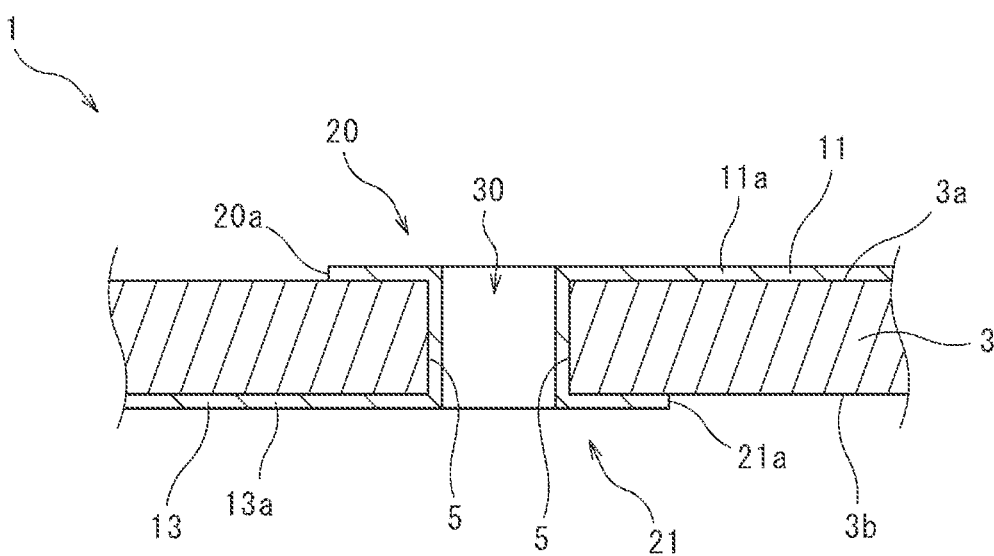
FIG. 2 is a schematic end view showing the printed wiring board of FIG. 1, as seen from a direction of arrows of a line A-A in FIG. 1.
Figure 3:
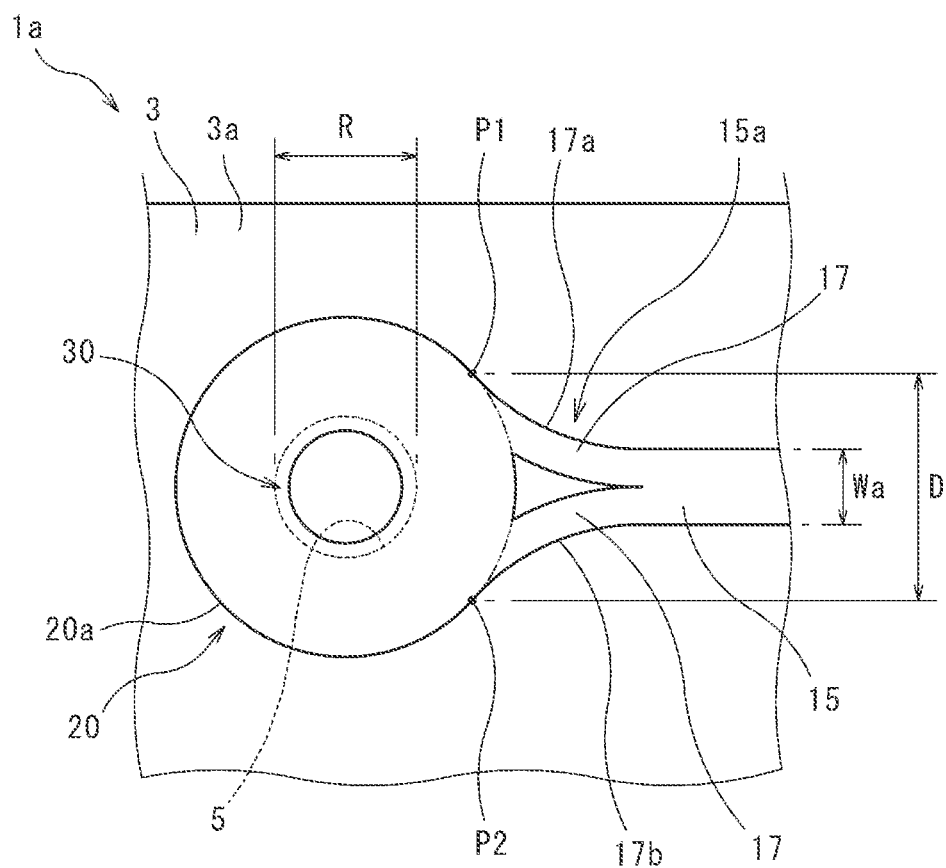
FIG. 3 is a schematic plan view showing a printed wiring board of a second embodiment.

As shown in FIGS. 1 and 2, a printed wiring board 1 of the present embodiment includes: a base film 3 as a board having a through-hole 5; a first land portion 20 that is disposed on an inner circumferential surface of through-hole 5 and on a front surface 3a of base film 3 at a circumferential edge of through-hole 5, and that has a through-hole conductor portion 30; and a first wire 11 that is disposed on front surface 3a of base film 3 and that has one longitudinal end portion electrically connected to land portion 20. Printed wiring board 1 includes: a second land portion 21 that is disposed on the inner circumferential surface of through-hole 5 and on a back surface 3b of base film 3, and that shares through-hole conductor portion 30 with first land portion 20; and a second wire 13 that is disposed on back surface 3b of base film 3 and that has one longitudinal end portion electrically connected to second land portion 21.

(Base Film)

Base film 3 is an insulating layer made of synthetic resin. Base film 3 is a base material for forming first wire 11 and second wire 13. Base film 3 may be flexible. A material forming base film 3 is not particularly limited as long as it is insulating, and a synthetic resin film having a low dielectric constant and formed as a sheet can be employed, for example. Examples of a main component of this synthetic resin film include polyimide, polyethylene terephthalate, a liquid crystal polymer, and a fluorine resin. The "main component" refers to a component with the highest content, for example, a component that accounts for 50% by mass or more in the forming material. Base film 3 may contain a resin such as an antistatic agent, other than the illustrated resins such as polyimide.

The lower limit of an average thickness of base film 3 is preferably 5 μm, and more preferably 10 μm, without being particularly limited. The upper limit of the average thickness of base film 3 is preferably 200 μm, more preferably 150 μm, further preferably 100 μm, and particularly preferably 50 μm, without being particularly limited. When the average thickness of base film 3 is less than the lower limit, base film 3 may have insufficient insulation strength and mechanical strength. When the average thickness of base film 3 exceeds the upper limit, on the other hand, printed wiring board 1 may become unnecessarily thick. The "average thickness" of base film 3 as used here refers to an average value of thicknesses measured at any ten points.

A maximum diameter R of through-hole 5 is not particularly limited, and can be set appropriately to satisfy such a relationship that a maximum length D (described later) is greater than or equal to the sum of this maximum diameter R and a minimum line width Wa (described later) of first wire 11.

(First Land Portion)

First land portion 20 is disposed on the inner circumferential surface of through-hole 5 in base film 3 and on front surface 3a of base film 3 at the circumferential edge of through-hole 5, and has through-hole conductor portion 30. First land portion 20 is made of the same type of metal so that through-hole conductor portion 30 and portions other than through-hole conductor portion 30 are integrated together.

For example, first land portion 20 is formed by a conductive base layer disposed on through-hole 5 and on front surface 3a of base film 3, and a plating layer disposed on this conductive base layer.

Examples of a material forming the conductive base layer include copper (Cu), silver (Ag), gold (Au), nickel (Ni), titanium (Ti), chromium (Cr), their alloys, and stainless steel.

For example, the lower limit of an average thickness of the conductive base layer is preferably 10 nm. The upper limit of the average thickness of the conductive base layer is preferably 12500 nm. When the average thickness of the conductive base layer falls short of the upper limit, the adhesion of a plating layer formed on the conductive base layer to the conductive base layer may be insufficient. When the average thickness of the conductive base layer exceeds the upper limit, on the other hand, the conductive base layer may not be removed sufficiently when removed with a plating layer as a mask after this plating layer has been formed on the conductive base layer, and this insufficient removal may result in a short circuit between adjacent wires. The "average thickness" of the conductive base layer refers to an average value of thicknesses measured at any ten points.

Examples of a metallic material for forming the plating layer include copper, aluminum, silver, gold, nickel, and their alloys. Of these materials, copper or a copper alloy is preferred from the viewpoint of providing good conductivity and reducing costs.

The plating layer has an average thickness that can be set appropriately, in consideration of the average thickness of the conductive base layer, so that first land portion 20 has an average thickness falling within a range that is described later.

Through-hole conductor portion 30 extends through base film 3 and is electrically connected to second land portion 21.

Through-hole conductor portion 30 has an inner diameter and a shape that can be set appropriately depending on the inner diameter and the shape of through-hole 5. For example, the lower limit of an average thickness of through-hole conductor portion 30 from the inner circumferential surface of through-hole 5 is preferably 5 μm. When the average thickness falls short of the lower limit, a region without conductors (the conductive base layer and the plating layer) may be partially generated in through-hole conductor portion 30, resulting in conduction failure. On the other hand, the upper limit of the average thickness of through-hole conductor portion 30 is less than the radius of through-hole 5.

A portion of first land portion 20 (hereinafter also referred to as a "flat portion") other than through-hole conductor portion 30 has an average thickness that is not particularly limited and can be set appropriately. For example, the lower limit of the average thickness of the flat portion of first land portion 20 is preferably 5 μm. The upper limit of the average thickness of the flat portion of first land portion 20 is preferably 100 μm. When the average thickness of the flat portion of first land portion 20 falls short of the lower limit, a region without conductors (the conductive base layer and the plating layer) may be partially generated in the flat portion of first land portion 20, resulting in conduction failure. When the average thickness of the flat portion of first land portion 20 exceeds the upper limit, on the other hand, the time required to form the plating layer may be extended, resulting in increased costs.

First land portion 20 has a planar shape that is not particularly limited and can be set appropriately. First land portion 20 has planar dimensions that are not particularly limited and can be set appropriately depending on the size of through-hole 5 and the like.

(First Wire)

First wire 11 is disposed on front surface 3a of base film 3, and has one longitudinal end portion 11a electrically connected to first land portion 20. First wire 11 is disposed on front surface 3a of base film 3 directly or through another layer. Examples of first wire 11 include a signal line for transmitting a signal, a current line for transmitting a current for power supply, and a current line for transmitting a current for magnetic field generation.

First wire 11 is formed by a conductive base layer disposed on front surface 3a of base film 3, and a plating layer disposed on this conductive base layer.

The lower limit of an average line width of first wire 11 is preferably 10 µm, more preferably 15 µm, and further preferably 20 µm. The upper limit of the average line width of first wire 11 is preferably 50 µm, more preferably 45 µm, and further preferably 40 µm. When the average line width of first wire 11 falls short of the lower limit, it may be difficult to form first wire 11. In addition, the adhesion strength between base film 3 and first wire 11 may decrease, resulting in first wire 11 being stripped from base film 3. When the average line width of wire 11 exceeds the upper limit, on the other hand, the wiring density may not meet a requirement. The "average line width" of first wire 11 as used here refers to a value obtained by averaging, in the longitudinal direction of wire 11, a maximum width of first wire 11 in a cross section perpendicular to the longitudinal direction.

The lower limit of an average thickness of first wire 11 is preferably the average thickness of the flat portion of first land portion 20 minus 10% of that thickness. Specifically, for example, the lower limit of the average thickness of first wire 11 is preferably 4.5 µm. When the average thickness of first wire 11 falls short of the lower limit, cracks may occur in a connection portion between first wire 11 and first land portion 20. On the other hand, the upper limit of the average thickness of first wire 11 is preferably about the same as the average thickness of the flat portion of first land portion 20.

When printed wiring board 1 has a plurality of first wires 11, the upper limit of an average spacing between adjacent first wires 11 is preferably 50 µm, more preferably 40 µm, further preferably 30 µm, and particularly preferably 25 µm. When the average spacing between first wires 11 falls short of the lower limit, a short circuit may occur between wires 11. When the average spacing between first wires 11 exceeds the upper limit, on the other hand, the wiring density may not meet a requirement. The "average spacing" between first wires 11 as used here refers to a value obtained by averaging, in the longitudinal direction of wires 11, a minimum distance between opposed side edges of adjacent first wires 11 in a cross section perpendicular to the longitudinal direction of first wires 11.

(Second Land Portion)

Second land portion 21 can be formed, for example, with dimensions similar to those of first land portion 20 using a material similar to that of first land portion 20. This second land portion 21 shares through-hole conductor portion 30 with first land portion 20.

(Second Wire)

Second wire 13 is formed, for example, using a material similar to that of first wire 11. Although not shown, in the present embodiment, an end portion 13a of second wire 13 on the second land portion 21 side is formed with dimensions similar to those of first wire 11.

<Relationship Between First Land Portion and First Wire>

In the present embodiment, maximum length D of the connection portion between first wire 11 and first land portion 20 (the distance between two intersections P1 and P2 of two outermost end edges 11b, 11c of first wire 11 in a width direction of first wire 11 and an outer circumferential edge 20a of first land portion 20) is greater than or equal to the sum of maximum diameter R of through-hole 5 and minimum line width Wa of first wire 11.

<Relationship Between Second Land Portion and Second Wire>

Although not shown, in the present embodiment, maximum length D of a connection portion between second wire 13 and second land portion 21 (the distance between two intersections of two outermost end edges of second wire 13 in a width direction of second wire 13 and an outer circumferential edge 21a of second land portion 21) is greater than or equal to the sum of maximum diameter R of through-hole 5 and minimum line width Wa of second wire 13.

<Method for Manufacturing Printed Wiring Board>

A method for manufacturing the printed wiring board of the present embodiment will now be described.

The method for manufacturing the printed wiring board of the present embodiment includes: a through-hole forming step of forming through-hole 5 in base film 3; a first forming step of forming conductive base layers by electroless plating of front surface 3a, back surface 3b of base film 3 and through-hole 5; a resist pattern forming step of forming, after this first forming step, resist patterns on the conductive base layers of front surface 3a and back surface 3b of the base film, respectively; a second forming step of forming first land portion 20, second land portion 21, first wire 11 and second wire 13 by electrolytic plating of the conductive base layer of through-hole 5 and a region of the conductive base layer of each of front surface 3a and back surface 3b where the resist pattern is not laminated; and a removing step of removing, after the second forming step, the resist patterns, and a region of the conductive base layer of each of front surface 3a and back surface 3b of base film 3 where first land portion 20, second land portion 21, first wire 11 and second wire 13 are not laminated.

Base film 3 described above is used as base film 3.

(Through-Hole Forming Step)

In this step, through-hole 5 is formed in base film 3 such as by drilling.

(First Forming Step) In this step, conductive base layers are formed by electroless plating of front surface 3a, back surface 3b of base film 3 and through-hole 5. In forming the conductive base layers, a forming material similar to that of the conductive base layer described above is used, to form conductive base layers having an average thickness similar to that of the conductive base layer described above.

<Resist Pattern Forming Step>

In this step, after the first forming step, resist patterns are formed on the conductive base layers of front surface 3a and back surface 3b of the base film, respectively. The shapes and dimensions of openings in the resist patterns can be set appropriately so as to form each plating layer of first land portion 20, second land portion 21, first wire 11 and second wire 13 described above. Specifically, resist films are laminated on the conductive base layers of front surface 3a and back surface 3b of base film 3, and then exposed and developed to form resist patterns having predetermined patterns. Example methods for laminating the resist films include a method for coating each conductive base layer with a resist composition, and a method for laminating a dry film photoresist on each conductive base layer. Exposure and development conditions for the resist films can be adjusted appropriately depending on the resist composition used. The shape of the openings in the resist pattern formed on front surface 3a is set appropriately so that, as described above, maximum length D of the connection portion between first wire 11 and first land portion 20 (the distance between two intersections P1 and P2 of outer circumferential edge 20a of first land portion 20 and both end edges 11b, 11c of first wire 11) is greater than or equal to the sum of maximum diameter R of through-hole 5 and minimum line width Wa of first wire 11. Additionally, in the present embodiment, the shape of the openings in the resist pattern formed on back surface 3b is set appropriately so that, as described above, maximum length D of the connection portion between second wire 13 and second land portion 21 (the distance between two intersections of outer circumferential edge 21a of second land portion 21 and both end edges of second wire 13) is greater than or equal to the sum of maximum diameter R of through-hole 5 and minimum line width Wa of second wire 13, although this is not shown.

<Second Forming Step>

In this step, first land portion 20, second land portion 21, first wire 11 and second wire 13 are formed by electrolytic plating of a region of each conductive base layer where the resist pattern is not laminated. Example types of this electrolytic plating include copper, aluminum, silver, gold, nickel, and their alloys, as described above. Of these materials, copper or a copper alloy is preferred from the viewpoint of providing good conductivity and reducing costs. As a plating solution, any known plating solution that allows for electrolytic plating of the conductive base layer with the metal can be used, without being particularly limited.

<Removing Step>

In this step, after the second forming step, the resist patterns, and a region of each conductive base layer where first land portion 20, second land portion 21, first wire 11 and second wire 13 are not laminated are removed. Specifically, this step includes a stripping step of stripping the resist patterns, and an etching step of etching a region of each conductive base layer where the plating layer is not laminated.

(Stripping Step)

In this step, after the electrolytic plating step, the resist pattern is stripped from each conductive base layer. Specifically, a stripping solution is used to strip the resist pattern. Any known stripping solution can be used, for example: an alkaline aqueous solution such as sodium hydroxide or potassium hydroxide; an organic acid solution such as alkylbenzene sulfonic acid; and a mixture of organic amines such as ethanolamine and a polar solvent.

(Etching Step)

In this step, after the stripping step, the conductive base layer is etched with each plating layer as a mask. This etching provides first land portion 20, second land portion 21, first wire 11 and second wire 13 as a laminate in which the plating layer is laminated on each of front surface 3a and back surface 3b of base film 3 through the conductive base layer. Through-hole conductor portion 30 is formed simultaneously with the formation of first land portion 20 and second land portion 21. The above etching uses a known etchant that erodes the metal forming the conductive base layer but does not erode the plating layer. In this manner, in the present embodiment, printed wiring board 1 can be manufactured with a semi-additive process. In other words, it is preferable that printed wiring board 1 be formed with a semi-additive process.

<Advantages>

With maximum length D of the connection portion being in the above range, printed wiring board 1 can suppress conduction failure even upon displacement of the position where through-hole 5 for through-hole conductor portion 30 is formed.

Second Embodiment

A printed wiring board 1a of the present embodiment has a third wire 15, instead of first wire 11, on front surface 3a of base film 3 as a board having through-hole 5. Third wire 15 has one end portion 15a on the first land portion 20 side, and one end portion 15a includes a plurality of branched portions 17. A maximum length D of a connection portion between the plurality of branched portions 17 of third wire 15 and first land portion 20 is a distance between two intersections P1 and P2 of two outermost end edges 17a, 17b of the plurality of branched portions 17 in a width direction of branched portions 17 and outer circumferential edge 20a of first land portion 20. The configuration is otherwise identical to that of the first embodiment, and therefore, a detailed description of printed wiring board 1a will not be provided.

End portion 15a of third wire 15 on the first land portion 20 side has the plurality of (in this case, two) branched portions 17. Two outermost end edges 17a, 17b of branched portions 17 in the width direction of branched portions 17 and outer circumferential edge 20a of first land portion 20 intersect at two intersections P1 and P2. The distance between these two intersections P1 and P2 is maximum length D of the connection portion between branched portions 17 and first land portion 20, and this maximum length D is greater than or equal to the sum of maximum diameter R of through-hole 5 and minimum line width Wa of third wire 15.

<Advantages>

With maximum length D of the connection portion being in the above range, printed wiring board 1a can suppress conduction failure even upon displacement of the position where through-hole 5 for through-hole conductor portion 30 in base film 3 is formed.

Additionally, in the present embodiment, with one end portion 15a of third wire 15 having the plurality of branched portions 17, conduction failure can be more reliably suppressed even upon positional displacement of through-hole 5.

The printed wiring boards according to the embodiments of the present disclosure can suppress conduction failure even upon displacement of the position where the through-hole for the through-hole conductor portion is formed, and can therefore be suitably used in small electronic devices and the like.

Other Embodiments

It should be construed that embodiments disclosed herein are given by way of illustration in all respects, not by way of limitation. It is intended that the scope of the present invention is defined by claims, rather than being limited to the configurations of the embodiments described above, and encompasses all modifications and variations equivalent in meaning and scope to the claims.

While maximum length D was described as being greater than or equal to the sum of maximum diameter R and minimum line width Wa in the land portions and the wires on both surfaces of the base film in the first embodiment, maximum length D may be greater than or equal to the sum of maximum diameter R and minimum line width Wa on one of the front surface and the back surface.

While the end portion of the wire on the land portion side on the front surface of the base film was described as having a plurality of branched portions in the second embodiment, the end portion of the wire on the land portion side on the back surface in addition to the front surface of the base film may have a plurality of branched portions.

While the wire was described as having two branched portions in the second embodiment, the wire may have three or more branched portions.

REFERENCE SIGNS LIST 1, 1a printed wiring board
3 base film (board)
3a front surface
3b back surface
5 through-hole
11 first wire
11a end portion of first wire on land portion side
13 second wire
13a end portion of second wire on land portion side
first land portion
20a outer circumferential edge
21 second land portion
21a outer circumferential edge
30 through-hole conductor portion
P1, P2 intersection
D maximum length of connection portion (distance between intersections)
R maximum diameter of through-hole
Wa minimum line width

The invention claimed is:

1. A printed wiring board comprising:
a board having a through-hole;
a land portion that is disposed on an inner circumferential surface of the through-hole and on a surface of the board at a circumferential edge of the through-hole, and that has a through-hole conductor portion; and
a wire that is disposed on the surface of the board and that has one longitudinal end portion electrically connected to the land portion,
a maximum length of a connection portion between the wire and the land portion being greater than or equal to a sum of a maximum diameter of the through-hole and a minimum line width of the wire.

2. The printed wiring board according to claim 1, wherein
the one end portion of the wire has a plurality of branched portions, and
the maximum length of the connection portion is a distance between two intersections of two outermost end edges of the plurality of branched portions in a width direction of the branched portions and the land portion.

* * * * *